(12) United States Patent
Khoury (10) Patent No.: US 8,514,608 B2
(45) Date of Patent: *Aug. 20, 2013

(54) BIPOLAR SELECT DEVICE FOR RESISTIVE SENSE MEMORY

(75) Inventor: Maroun Georges Khoury, Burnsville, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/422,219

(22) Filed: Mar. 16, 2012

(65) Prior Publication Data

US 2012/0175718 A1 Jul. 12, 2012

Related U.S. Application Data

(63) Continuation of application No. 12/498,661, filed on Jul. 7, 2009, now Pat. No. 8,159,856.

(51) Int. Cl.
*G11C 11/00* (2006.01)
*G11C 7/00* (2006.01)
*H01L 29/82* (2006.01)

(52) U.S. Cl.
USPC ...... 365/148; 365/189.16; 365/242; 365/171; 257/421; 257/2; 257/E29.323

(58) Field of Classification Search
USPC .............. 365/148, 189.16, 242, 17; 257/2, 257/241, E29.323, 421
See application file for complete search history.

(56) References Cited

U.S. PATENT DOCUMENTS

| 3,982,233 | A | 9/1976 | Crookshanks |
| 3,982,235 | A | 9/1976 | Bennett |
| 3,982,266 | A | 9/1976 | Matzen |
| 4,056,642 | A | 11/1977 | Saxena |
| 4,110,488 | A | 8/1978 | Risko |
| 4,160,988 | A | 7/1979 | Russell |
| 4,232,057 | A | 11/1980 | Ray |

(Continued)

FOREIGN PATENT DOCUMENTS

| DE | 102008026432 | 12/2009 |
| EP | 1329895 | 7/2003 |

(Continued)

OTHER PUBLICATIONS

Adee, S., "Quantum Tunneling Creates Fast Lane for Wireless", IEEE Spectrum, Oct. 2007.

(Continued)

*Primary Examiner* — Toan Le
*Assistant Examiner* — Hai Pham
(74) *Attorney, Agent, or Firm* — Mueting Raasch & Gebhardt PA (57) ABSTRACT

A resistive sense memory apparatus includes a bipolar select device having a semiconductor substrate, a plurality of collector contacts disposed in a first side of the of the semiconductor substrate, an emitter contact layer disposed in a second side of the semiconductor substrate, and a base layer separating the plurality of collector contacts from the emitter contact layer. Each collector contact is electrically isolated from each other. A resistive sense memory cells is electrically coupled to each collector contacts and a bit line. The base layer and the emitter contact layer provide an electrical path for the plurality of collector contacts.

20 Claims, 5 Drawing Sheets

(56) References Cited

U.S. PATENT DOCUMENTS

| | | |
|---|---|---|
| 4,247,915 A | 1/1981 | Bartlett |
| 4,323,589 A | 4/1982 | Ray |
| 4,576,829 A | 3/1986 | Kaganowicz |
| 4,901,132 A | 2/1990 | Kuwano |
| 5,083,190 A | 1/1992 | Pfiester |
| 5,135,878 A | 8/1992 | Bartur |
| 5,278,636 A | 1/1994 | Williams |
| 5,330,935 A | 7/1994 | Dobuzinsky |
| 5,365,083 A | 11/1994 | Tada |
| 5,412,246 A | 5/1995 | Dobuzinsky |
| 5,443,863 A | 8/1995 | Neely |
| 5,580,804 A | 12/1996 | Joh |
| 5,614,430 A | 3/1997 | Liang |
| 5,739,564 A | 4/1998 | Kosa |
| 5,872,052 A | 2/1999 | Iyer |
| 5,913,149 A | 6/1999 | Thakur |
| 5,923,948 A | 7/1999 | Cathey, Jr. |
| 5,926,412 A | 7/1999 | Evans |
| 5,929,477 A | 7/1999 | McAllister |
| 6,011,281 A | 1/2000 | Nunokawa |
| 6,013,548 A | 1/2000 | Burns |
| 6,034,389 A | 3/2000 | Burns |
| 6,077,745 A | 6/2000 | Burns |
| 6,100,166 A | 8/2000 | Sakaguchi |
| 6,114,211 A | 9/2000 | Fulford |
| 6,121,642 A | 9/2000 | Newns |
| 6,121,654 A | 9/2000 | Likharev |
| 6,165,834 A | 12/2000 | Agarwal |
| 6,300,205 B1 | 10/2001 | Fulford |
| 6,341,085 B1 | 1/2002 | Yamagami |
| 6,346,477 B1 | 2/2002 | Koloyeros |
| 6,376,332 B1 | 4/2002 | Yankagita |
| 6,448,840 B2 | 9/2002 | Kao |
| 6,534,382 B1 | 3/2003 | Sakaguchi |
| 6,617,642 B1 | 9/2003 | Georgesca |
| 6,624,463 B2 | 9/2003 | Kim |
| 6,653,704 B1 | 11/2003 | Gurney |
| 6,667,900 B2 | 12/2003 | Lowrey |
| 6,724,025 B1 | 4/2004 | Takashima |
| 6,750,540 B2 | 6/2004 | Kim |
| 6,753,561 B1 | 6/2004 | Rinerson et al. |
| 6,757,842 B2 | 6/2004 | Harari |
| 6,781,176 B2 | 8/2004 | Ramesh |
| 6,789,689 B1 | 9/2004 | Beale |
| 6,800,897 B2 | 10/2004 | Baliga |
| 6,842,368 B2 | 1/2005 | Hayakawa |
| 6,853,031 B2 | 2/2005 | Lio |
| 6,917,539 B2 | 7/2005 | Rinerson |
| 6,940,742 B2 | 9/2005 | Yamamura |
| 6,944,052 B2 | 9/2005 | Subramanian |
| 6,979,863 B2 | 12/2005 | Ryu |
| 7,009,877 B1 | 3/2006 | Huai |
| 7,045,840 B2 | 5/2006 | Tamai |
| 7,051,941 B2 | 5/2006 | Yui |
| 7,052,941 B2 | 5/2006 | Lee |
| 7,098,494 B2 | 8/2006 | Pakala |
| 7,130,209 B2 | 10/2006 | Reggiori |
| 7,161,861 B2 | 1/2007 | Gogl |
| 7,187,577 B1 | 3/2007 | Wang |
| 7,190,616 B2 | 3/2007 | Forbes |
| 7,200,036 B2 | 4/2007 | Bessho |
| 7,215,568 B2 | 5/2007 | Liaw |
| 7,218,550 B2 | 5/2007 | Schwabe |
| 7,224,601 B2 | 5/2007 | Panchula |
| 7,233,537 B2 | 6/2007 | Tanizaki |
| 7,236,394 B2 | 6/2007 | Chen |
| 7,247,570 B2 | 7/2007 | Thomas |
| 7,272,034 B1 | 9/2007 | Chen |
| 7,272,035 B1 | 9/2007 | Chen |
| 7,273,638 B2 | 9/2007 | Belyansky |
| 7,274,067 B2 | 9/2007 | Forbes |
| 7,282,755 B2 | 10/2007 | Pakala |
| 7,285,812 B2 | 10/2007 | Tang |
| 7,286,395 B2 | 10/2007 | Chen |
| 7,289,356 B2 | 10/2007 | Diao |
| 7,345,912 B2 | 3/2008 | Luo |
| 7,362,618 B2 | 4/2008 | Harari |
| 7,378,702 B2 | 5/2008 | Lee |
| 7,379,327 B2 | 5/2008 | Chen |
| 7,381,595 B2 | 6/2008 | Joshi |
| 7,382,024 B2 | 6/2008 | Ito |
| 7,391,068 B2 | 6/2008 | Kito |
| 7,397,713 B2 | 7/2008 | Harari |
| 7,413,480 B2 | 8/2008 | Thomas |
| 7,414,908 B2 | 8/2008 | Miyatake |
| 7,416,929 B2 | 8/2008 | Mazzola |
| 7,432,574 B2 | 10/2008 | Nakamura |
| 7,440,317 B2 | 10/2008 | Bhattacharyya |
| 7,443,710 B2 | 10/2008 | Fang |
| 7,456,069 B2 * | 11/2008 | Johansson et al. ............ 438/325 |
| 7,459,717 B2 | 12/2008 | Lung |
| 7,465,983 B2 | 12/2008 | Eldridge |
| 7,470,142 B2 | 12/2008 | Lee |
| 7,470,598 B2 | 12/2008 | Lee |
| 7,502,249 B1 | 3/2009 | Ding |
| 7,515,457 B2 | 4/2009 | Chen |
| 7,529,114 B2 | 5/2009 | Asao |
| 7,542,356 B2 | 6/2009 | Lee |
| 7,646,629 B2 | 1/2010 | Hamberg |
| 7,697,322 B2 | 4/2010 | Leuschner |
| 7,738,279 B2 | 6/2010 | Siesazeck |
| 7,738,881 B2 | 6/2010 | Krumm et al. |
| 7,791,057 B2 | 9/2010 | Lung |
| 7,869,257 B2 | 1/2011 | Philipp |
| 2001/0046154 A1 | 11/2001 | Forbes |
| 2002/0081822 A1 | 6/2002 | Yanageta |
| 2002/0136047 A1 | 9/2002 | Scheuerlein |
| 2003/0045064 A1 | 3/2003 | Kunikiyo |
| 2003/0168684 A1 | 9/2003 | Pan |
| 2004/0084725 A1 | 5/2004 | Nishiwaki |
| 2004/0114413 A1 | 6/2004 | Parkinson |
| 2004/0114438 A1 | 6/2004 | Morimoto |
| 2004/0257878 A1 | 12/2004 | Morikawa |
| 2004/0262635 A1 | 12/2004 | Lee |
| 2005/0044703 A1 | 3/2005 | Liu |
| 2005/0092526 A1 | 5/2005 | Fielder |
| 2005/0122768 A1 | 6/2005 | Fukumoto |
| 2005/0145947 A1 | 7/2005 | Russ et al. |
| 2005/0169043 A1 * | 8/2005 | Yokoyama et al. ............ 365/156 |
| 2005/0218521 A1 | 10/2005 | Lee |
| 2005/0253143 A1 | 11/2005 | Takaura |
| 2005/0280042 A1 | 12/2005 | Lee |
| 2005/0280061 A1 | 12/2005 | Lee |
| 2005/0280154 A1 | 12/2005 | Lee |
| 2005/0280155 A1 | 12/2005 | Lee |
| 2005/0280156 A1 | 12/2005 | Lee |
| 2005/0282356 A1 | 12/2005 | Lee |
| 2006/0073652 A1 | 4/2006 | Pellizzer |
| 2006/0105517 A1 | 5/2006 | Johansson |
| 2006/0131554 A1 | 6/2006 | Joung |
| 2006/0275962 A1 | 12/2006 | Lee |
| 2007/0007536 A1 | 1/2007 | Hidaka |
| 2007/0077694 A1 | 4/2007 | Lee |
| 2007/0105241 A1 | 5/2007 | Leuschner |
| 2007/0113884 A1 | 5/2007 | Kensey |
| 2007/0115749 A1 | 5/2007 | Gilbert |
| 2007/0253245 A1 | 11/2007 | Ranjan |
| 2007/0279968 A1 | 12/2007 | Luo |
| 2007/0281439 A1 | 12/2007 | Bedell |
| 2007/0297223 A1 | 12/2007 | Chen |
| 2008/0007993 A1 | 1/2008 | Saitoh |
| 2008/0025083 A1 | 1/2008 | Okhonin |
| 2008/0029782 A1 | 2/2008 | Carpenter |
| 2008/0032463 A1 | 2/2008 | Lee |
| 2008/0037314 A1 | 2/2008 | Ueda |
| 2008/0038902 A1 | 2/2008 | Lee |
| 2008/0048327 A1 | 2/2008 | Lee |
| 2008/0094873 A1 | 4/2008 | Lai |
| 2008/0108212 A1 | 5/2008 | Moss |
| 2008/0144355 A1 | 6/2008 | Boeve |
| 2008/0170432 A1 | 7/2008 | Asao |
| 2008/0191312 A1 | 8/2008 | Oh |
| 2008/0261380 A1 | 10/2008 | Lee |
| 2008/0265360 A1 | 10/2008 | Lee |

| | | |
|---|---|---|
| 2008/0273380 A1 | 11/2008 | Diao |
| 2008/0310213 A1 | 12/2008 | Chen |
| 2008/0310219 A1 | 12/2008 | Chen |
| 2009/0014719 A1 | 1/2009 | Shimizu |
| 2009/0040855 A1 | 2/2009 | Luo |
| 2009/0052225 A1 | 2/2009 | Morimoto |
| 2009/0072246 A1 | 3/2009 | Genrikh |
| 2009/0072279 A1 | 3/2009 | Moselund |
| 2009/0161408 A1 | 6/2009 | Tanigami |
| 2009/0162979 A1 | 6/2009 | Yang |
| 2009/0185410 A1 | 7/2009 | Huai |
| 2009/0296449 A1 | 12/2009 | Slesazeck |
| 2010/0007344 A1 | 1/2010 | Guo |
| 2010/0046285 A1 * | 2/2010 | Lung ............................ 365/163 |
| 2010/0067281 A1 | 3/2010 | Xi |
| 2010/0078620 A1 | 5/2010 | Khoury |
| 2010/0110756 A1 | 5/2010 | Khoury |
| 2010/0142256 A1 | 6/2010 | Kumar |
| 2010/0149856 A1 | 6/2010 | Tang |
| 2011/0026307 A1 | 2/2011 | Khoury |

FOREIGN PATENT DOCUMENTS

| | | |
|---|---|---|
| WO | WO 0062346 | 10/2000 |
| WO | WO 0215277 | 2/2002 |
| WO | WO 2005/124787 | 12/2005 |
| WO | WO 2006/100657 | 9/2006 |
| WO | WO 2007/100626 | 9/2007 |
| WO | WO 2007/128738 | 11/2007 |

OTHER PUBLICATIONS

Chung et al., A New SOI Inverter for Low Power Applications, Proceedings 1996 IEEE International SOI Conference, Oct. 1996.

Giacomini, R., et al., Modeling Silicon on Insulator MOS Transistors with Nonrectangular-Gate Layouts, Journal of the Electrochemical Society, 2006, pp. G218-G222, vol. 153, No. 3.

Hosomi et al., A Novel Nonvolatile Memory with Spin Torque Transfer Magnetization Switching: Spin-RAM, 2005 IEEE.

Hwang et al., Degradation of MOSFET's Drive Current Due to Halo Ion Implantation, Electron Devices Meeting, 1996, International Date: Dec. 8-11, 1996, pp. 567-570.

Internet website www.en.wikipedia.org/wiki/High-k dated Nov. 12, 2008.

Likharev, K., "Layered tunnel barrier for nonvolatile memory devices", Applied Physics Letters vol. 73, No. 15; Oct. 12, 1998.

Londergran et al., Interlayer Mediated Epitaxy of Cobalt Silicide on Silicon (100) from Low Temperature Chemical Vapor Deposition of Cobalt, Journal of the Electrochemical Society, 148 (1) C21-C27 (2001) C21.

PCT/ISA/210 Int'l Search Report and PCT/ISA/237 Written Opinion for PCT/US2010/041134 from the EPO.

Romanyuk, A., et al., Temperature-induced metal-semiconductor transition in W-doped VO2 films studied by photoelectron spectroscopy, Solar Energy Materials and Solar Cells, 2007, pp. 1831-1835, No. 91, Elsevier, Switzerland.

Sayan, S., "Valence and conduction band offsets of a ZrO2/SiOxNy/ n-Si CMOS gate stack: A combined photoemission and inverse photoemission study", Phys. Stat. Sol. (b) 241, No. 10, pp. 2246-2252 (2004).

Takato et al., High Performance CMOS Surrounding Gate Transistor (SGT) for Ultra High Density LSIs, Downloaded on Apr. 14, 2009 from IEEE Xplore, pp. 222-225.

U.S. Appl. No. 12/175,545, filed Jul. 18, 2008, Inventors: Lou et al.

U.S. Appl. No. 12/120,715, filed May 15, 2008, Inventors: Tian et al.

U.S. Appl. No. 12/498,661, filed Jul. 7, 2009, Inventor: Khoury.

Wang et al., Precision Control of Halo Implanation for Scaling-down ULSI Manufacturing, IEEE International Symposium on Sep. 13-15, 2005, pp. 204-207.

Zahler, James, et al., Wafer Bonding and Layer Transfer Processes for High Efficiency Solar Cells, NCPV and Solar Program Review Meeting, pp. 723-726, 2003.

U.S. Appl. No. 12/502,211, filed Jul. 13, 2009; Inventor: Li.

* cited by examiner

BIPOLAR SELECT DEVICE FOR RESISTIVE SENSE MEMORY

CROSS-REFERENCE TO RELATED APPLICATION

This application is a continuation application of Ser. No. 12/498,661, filed Jul. 7, 2009, now U.S. Pat. No. 8,159,856, the contents of which is hereby incorporated by reference in its entirety.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe. Resistive RAM (RRAM) is another resistive sense memory that has a variable resistance layer that can switch between a high resistance state and a low resistance state (for example by the presence or absence of a conductive filament) by applicant of a current or voltage.

However, some yield-limiting factors must be overcome before resistive sense memory enters the production stage. One challenge is that the resistive sense memory element often requires a large current in order for writing to occur. In particular, spin torque RAM (STRAM) requires high currents at fast write speeds. MOSFET select transistors have been used in such resistive sense memories. However, the area required by the MOSFET to achieve the currents needed is large. There is a need for select devices having reduced area requirements at specified writing currents for resistive sense memories.

BRIEF SUMMARY

The present disclosure relates to a bipolar select device for resistive sense memory. In particular, the present disclosure relates to a resistive sense memory apparatus that includes a bipolar select transistor that has high drive current capability for its size. The bipolar select transistor consumes a small area and shares one contact across multiple memory cells.

One illustrative resistive sense memory apparatus includes a bipolar select device having a semiconductor substrate, a plurality of collector contacts disposed in a first side of the of the semiconductor substrate, an emitter contact layer disposed in a second side of the semiconductor substrate, and a base layer separating the plurality of collector contacts from the emitter contact layer. Each collector contact is electrically isolated from each other. A resistive sense memory cells is electrically coupled to each collector contacts and a bit line. The base layer and the emitter contact layer provide an electrical path for the plurality of collector contacts.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a bipolar select device for resistive sense memory. In particular, the present disclosure relates to a resistive sense memory apparatus that includes a bipolar select transistor that has high drive current capability for its size. The bipolar select transistor consumes a small area and shares one contact across multiple memory cells, thus the number of electrical contacts is reduced. While the present disclosure is not so limited, an appreciation of various aspects of the disclosure will be gained through a discussion of the examples provided below.

Variable resistive memory includes memory cells that switch between at least a low resistance data state and a high resistance data state by passing a write current through the resistive memory cell (i.e., resistive RAM or RRAM). In some embodiments the resistive memory cell is a phase change data cell (i.e., PCRAM) or a programmable metallization data cell (i.e., PMCRAM). In some embodiments the resistive memory is a magnetic tunnel junction such as, for example, a spin transfer torque memory cell (i.e., STRAM). These magnetic tunnel junction data cells are further described below. Semiconductor fabrication techniques can be utilized to form the resistive sense memory apparatus and arrays described herein. The terms "emitter" and "collector" are interchangeable depending on the direction current is flowing through the resistive sense memory apparatus and arrays described herein.

The resistive sense memory apparatus described herein allows bipolar electrical conduction through the device at bulk conduction transport rates, allowing higher current flow per area than conventional semiconductor transistor select devices. Thus, the area required for each resistive sense memory apparatus can be reduced and the density of the memory array is increased, as compared to conventional memory array devices. Thus the select devices described herein can be termed as either NPN or PNP devices. An NPN device can have a deep Pwell for isolation purposes and a PNP device can have a deep Nwell for isolation purposes. In either case, an oxide region can work for isolation purposes.

Figure 1:
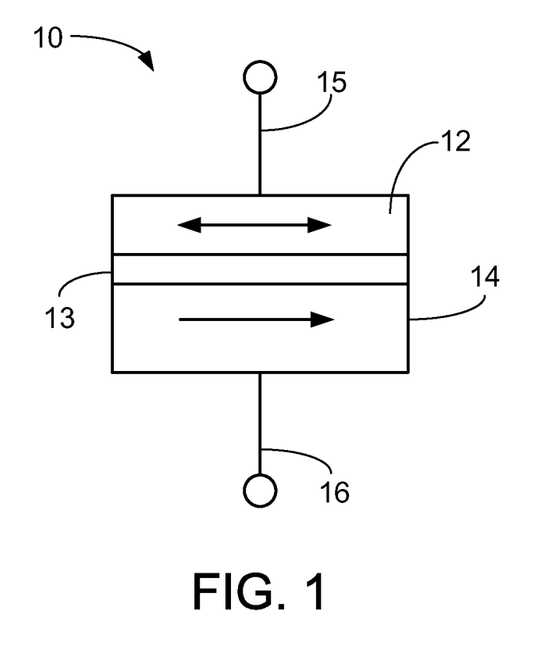
FIG. 1 is a cross-sectional schematic diagram of an illustrative magnetic tunnel junction data cell.

FIG. 1 is a cross-sectional schematic diagram of an illustrative magnetic tunnel junction data cell 10. The magnetic tunnel junction data cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the magnetic tunnel junction data cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others. When the magnetization orientation of the ferromagnetic free layer 12 is parallel and in the same direction of the magnetization orientation of the ferromagnetic reference layer 14 the magnetic tunnel junction is described as being in the low resistance state or "0" data state. When the magnetization orientation of the ferromagnetic free layer 12 is anti-parallel and in the opposite direction of the magnetization orientation of the ferromagnetic reference layer 14 the magnetic tunnel junction is described as being in the high resistance state or "1" data state.

Switching the resistance state and hence the data state of the magnetic tunnel junction data cell 10 via spin-transfer occurs when a current, passing through a magnetic layer of the magnetic tunnel junction data cell 10, becomes spin polarized and imparts a spin torque on the free layer 12 of the magnetic tunnel junction data cell 10. When a sufficient spin torque is applied to the free layer 12, the magnetization orientation of the free layer 12 can be switched between two opposite directions and accordingly the magnetic tunnel junction data cell 10 can be switched between the parallel state (i.e., low resistance state or "0" data state) and anti-parallel state (i.e., high resistance state or "1" data state) depending on the direction of the current.

The illustrative spin-transfer torque magnetic tunnel junction data cell 10 may be used to construct a memory device that includes multiple magnetic tunnel junction data cells in an array where a data bit is stored in magnetic tunnel junction data cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque magnetic tunnel junction data cell 10 to have the characteristics of a non-volatile random access memory, the free layer exhibits thermal stability against random fluctuations so that the orientation of the free layer is changed only when it is controlled to make such a change.

Figure 2:
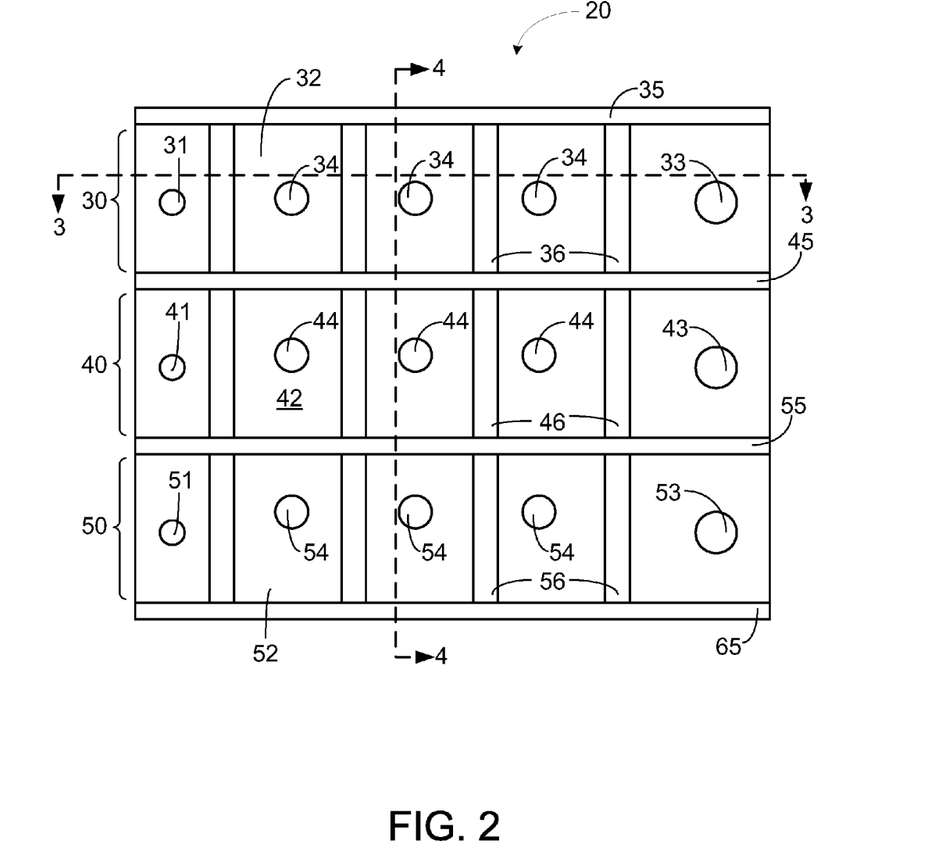
FIG. 2 is a top view schematic diagram of an illustrative resistive sense memory array.

FIG. 2 is a top view schematic diagram of an illustrative resistive sense memory array 20. The resistive sense memory array 20 shown includes three resistive sense memory apparatus or devices 30, 40 and 50 arranged as a plurality of rows and separated by deep trench isolation elements 35, 45, 55, and 65. The deep trench isolation elements 35, 45, 55, and 65 can be any useful electrically isolating element such as an oxide material, for example. The deep trench isolation elements 35, 45, 55, and 65 electrically isolate the resistive sense memory apparatus or devices 30, 40 and 50 from each other.

Each resistive sense memory apparatus or devices 30, 40 and 50 include a bipolar select device that is electrically coupled to a plurality of resistive sense memory cells. The bipolar select device includes a semiconductor substrate 32, 42, and 52 and a plurality of collector contacts 34, 44, and 54. Each collector contact 34, 44, and 54 is disposed on a first side or major surface of the semiconductor substrate and is electrically coupled to a resistive sense memory cell, as described below. Each collector contact 34, 44, and 54 is electrically isolated from each other with an isolation element 36, 46, and 56. The isolation element 36, 46, and 56 can be any useful electrically isolating element such as an oxide material, for example.

Each resistive sense memory apparatus or devices 30, 40 and 50 include an emitter contact 33, 43, and 53. The illustrated emitter contact 33, 43, and 53 extends through the first side or major surface of the resistive sense memory apparatus or devices 30, 40 and 50 and is electrically coupled to a source line. The illustrated emitter contact 33, 43, and 53 extends through the first side or major surface of the resistive sense memory apparatus or devices 30, 40 and 50 and is electrically coupled to an emitter contact layer (described below).

Each resistive sense memory apparatus or devices 30, 40 and 50 include a base contact 31, 41, and 51. The illustrated base contact 31, 41, and 51 extends through the first side or major surface of the resistive sense memory apparatus or devices 30, 40 and 50 and is electrically coupled to a word line. The illustrated base contact 31, 41, and 51 extends through the first side or major surface of the resistive sense memory apparatus or devices 30, 40 and 50 and is electrically coupled to a base layer (described below). In some embodiments, the emitter contact 33, 43, and 53 and the base contact 31, 41, and 51 are disposed adjacent to each other or on a same side of the resistive sense memory apparatus or devices 30, 40 and 50.

Each resistive sense memory apparatus or devices 30, 40 and 50 can be described as a three contact device. One word line and one source line provide an electrical path to a plurality of resistive sense memory cells by selecting the desired bit line electrically couple to the resistive sense memory cells.

Figure 3:
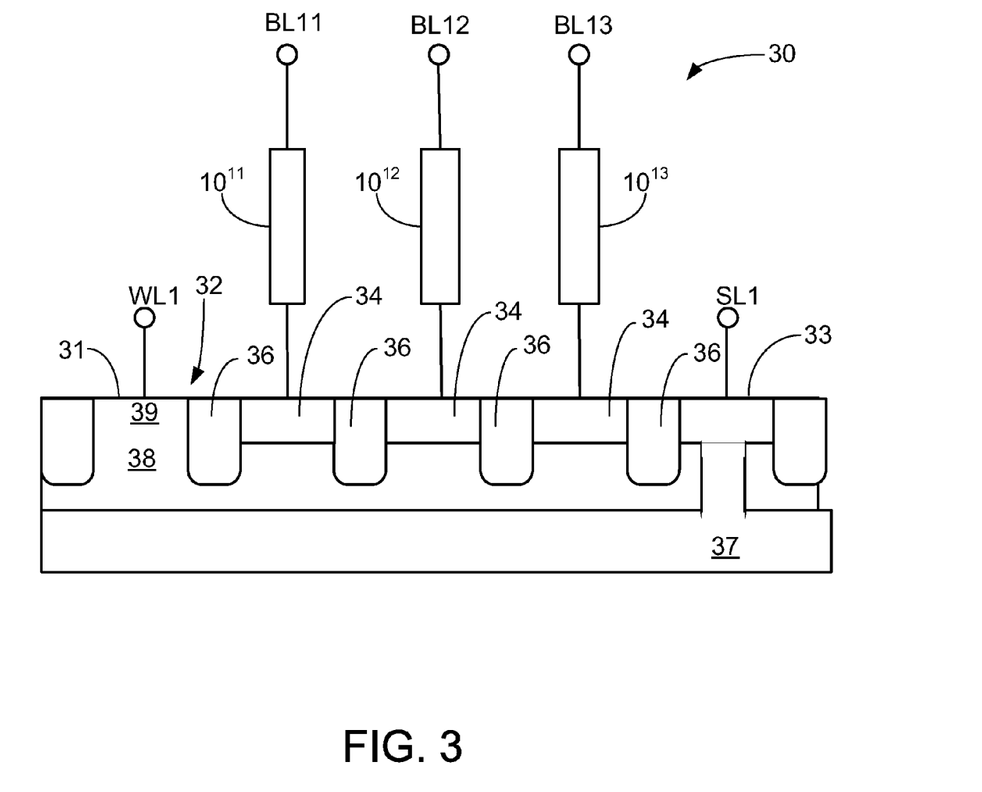
FIG. 3 is a cross-sectional schematic diagram of the illustrative resistive sense memory apparatus of FIG. 2 taken along line 3-3.

FIG. 3 is a cross-sectional schematic diagram of the illustrative resistive sense memory apparatus of FIG. 2 taken along line 3-3. While the figures illustrate three resistive sense memory apparatus or devices each having three resistive sense memory cells, it is understood that the resistive sense memory array can include any useful number of resistive sense memory apparatus each having any useful number of resistive sense memory cells.

The illustrative resistive sense memory apparatus 30 includes three collector contacts 34. Each collector contact 34 is electrically isolated from each other with an isolation element 36, as described above, and are disposed in a first side of the of the semiconductor substrate 32 (an upper or top side of FIG. 3). An emitter contact layer 37 is disposed in a second side of the semiconductor substrate 32 (a lower or bottom side of FIG. 3) the emitter contact layer 37 is electrically coupled to the emitter contact 33 that extends through the first side of the of the semiconductor substrate 32. The second side opposes the first side.

A base layer 38 separates the plurality of collector contacts 34 from the emitter contact layer 37. The base layer 38 is electrically coupled to the base contact 31 that extends through the of the base contact region 39 in the first side of the semiconductor substrate 32. A resistive sense memory cell $10^{11}$, $10^{12}$, $10^{13}$ is electrically coupled to one of the plurality of collector contacts 34 and a bit line BL11, BL12, BL13. The base layer 38 and the emitter contact layer 37 provide an electrical path for the plurality of collector contacts 34. The base layer 38 is electrically coupled to a word line WL1 through the base contact region 39. The base contact region or layer 39 is made of a similar semiconductor material type as the base layer 38 except for it having a higher level of doping. The emitter contact layer 37 is electrically coupled to a source line SL1. One word line WL1 and one source line SL1 provide an electrical path to a plurality of resistive sense memory cells $10^{11}$, $10^{12}$, $10^{13}$ by selecting the desired bit line BL11, BL12, BL13 that is electrically coupled to the resistive sense memory cell. Thus, the number of contacts required to construct the resistive sense memory apparatus is reduced.

Figure 4:
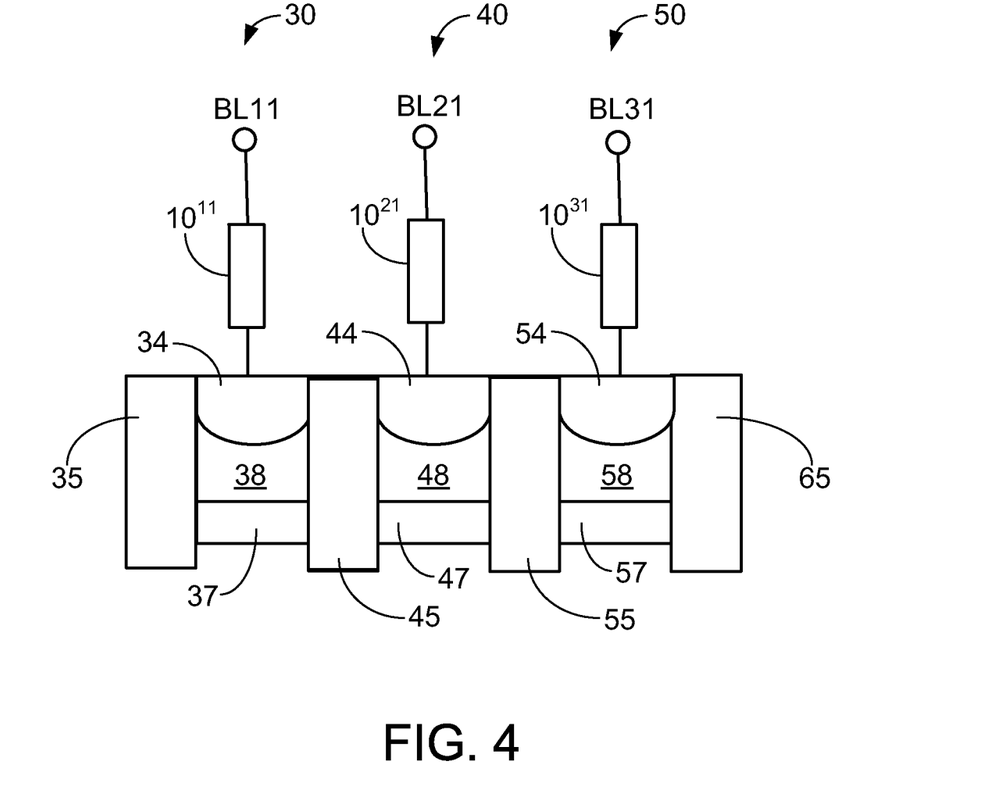
FIG. 4 is a cross-sectional schematic diagram of the illustrative resistive sense memory apparatus of FIG. 2 taken along line 4-4.

FIG. 4 is a cross-sectional schematic diagram of the illustrative resistive sense memory apparatus of FIG. 2 taken along line 4-4. The illustrative resistive sense memory array includes three resistive sense memory apparatus 30, 40 and 50. One collector contact 34, 44 and 54 is shown for each resistive sense memory apparatus 30, 40 and 50.

Each collector contact 34, 44 and 54 is electrically isolated from each other with an isolation element 45 and 55, as described above, and are disposed in a first side of the of the semiconductor substrate (an upper or top side of FIG. 4). An emitter contact layer 37, 47, and 57 is disposed in a second side of the semiconductor substrate (a lower or bottom side of FIG. 4) the emitter contact layer 37, 47 and 57 is electrically coupled to the emitter contact that extends through the first side of the of the semiconductor substrate. The second side opposes the first side. A base layer 38, 48 and 58 separates the plurality of collector contacts 34, 44 and 54 from the emitter contact layer 37, 47 and 57. The base layer 38, 48 and 58 is electrically coupled to the base contact that extends through the first side of the of the semiconductor substrate.

A resistive sense memory cell $10^{11}$, $10^{21}$, $10^{31}$ is electrically coupled to one of the plurality of collector contacts 34, 44, and 54 and a bit line BL11, BL21, BL31. The base layer 38, 48 and 58 and the emitter contact layer 37, 47 and 57 provide an electrical path for the plurality of collector contacts 34, 44, and 54. The base layer 38, 48 and 58 is electrically coupled to a word line and the emitter contact layer 37, 47 and 57 is electrically coupled to a word line. One word line and one source line provide an electrical path to a plurality of resistive sense memory cells $10^{11}$, $10^{21}$, $10^{31}$ selecting the desired bit line BL11, BL21, BL31 that is electrically coupled to the resistive sense memory cell. Thus, the number of contacts required to construct the resistive sense memory apparatus is reduced.

The collector contacts 34, 44 and 54 and the emitter contact layer 37, 47 and 57 has the same conductivity type and the base layer 38, 48 and 58 and base contact region 39 has an opposing conductivity type. In many embodiments, the collector contacts 34, 44 and 54 and the emitter contact layer 37, 47 and 57 have N type conductivity and the base layer 38, 48 and 58 has P type conductivity. In other embodiments, the collector contacts 34, 44 and 54 and the emitter contact layer 37, 47 and 57 have P type conductivity and the base layer 38, 48 and 58 has N type conductivity.

Figure 5:
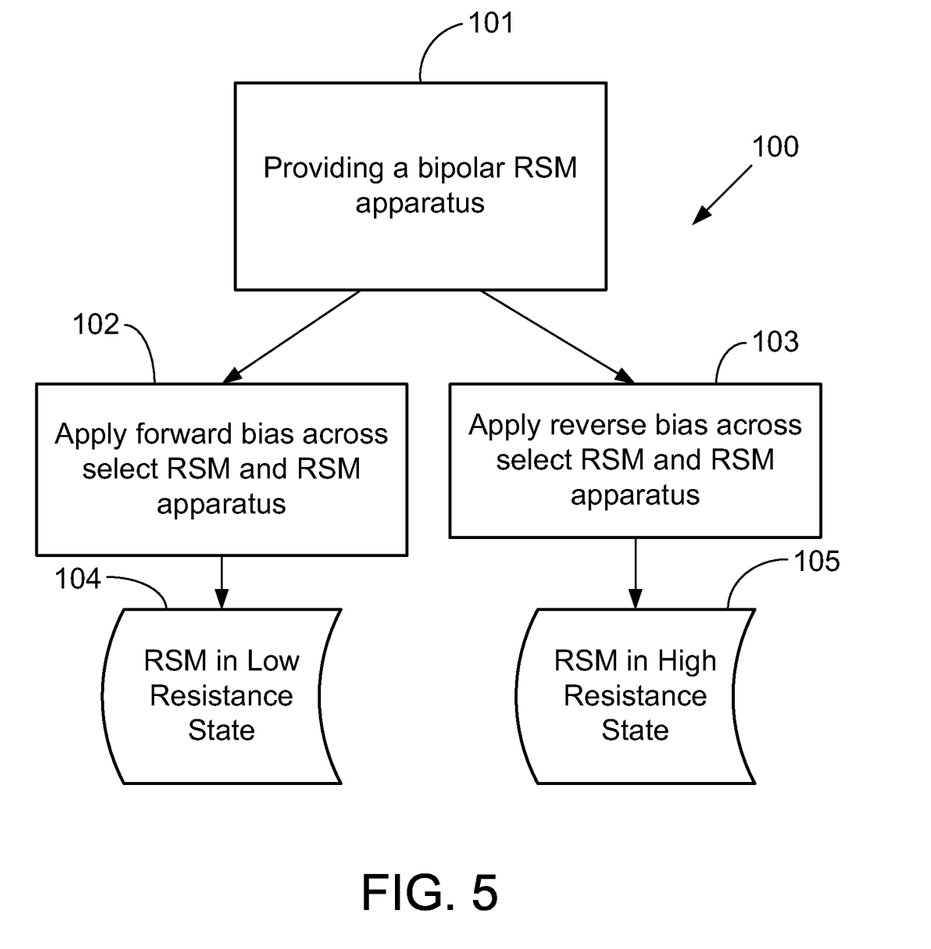
FIG. 5 is a flow diagram of an illustrative method of writing to a memory unit array.

FIG. 5 is a flow diagram of an illustrative method of writing to a memory unit array 100. The method includes providing a bipolar resistive sense memory (RSM) apparatus as described above at block 101. Then the method includes writing a first data state (i.e., low resistance state) to a plurality of resistive sense memory cells by applying a forward bias across an emitter contact layer of a bipolar select device and selected bit lines electrically coupled to the plurality of resistive sense memory cells to be written to at block 102 or writing a second data state (i.e., high resistance state) to a plurality of resistive sense memory cells by applying a reverse bias across an emitter contact layer of a bipolar select device and selected bit lines electrically coupled to the plurality of resistive sense memory cells to be written to at block 103. The forward bias condition places one or more resistive sense memory cells in the low resistance state at block 104 and reverse bias condition places one or more resistive sense memory cells in the high resistance state at block 105.

Thus, embodiments of the BIPOLAR SELECT DEVICE FOR RESISTIVE SENSE MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:
1. A spin transfer torque memory apparatus comprising:
   a bipolar select device comprising:
   a semiconductor substrate having a first side and an opposing second side;
   a plurality of collector contacts disposed in the first side of the of the semiconductor substrate, wherein each collector contact is electrically isolated from each other;
   an emitter contact layer disposed in the second side of the semiconductor substrate, the emitter contact layer being electrically coupled to a source line; and a base layer disposed between the plurality of collector contacts and the emitter contact layer, the base layer being electrically coupled to a word line; and a plurality of spin transfer torque memory cells, wherein one of the plurality of spin transfer torque memory cells is electrically coupled to one of the plurality of collector contacts and a bit line associated with the one of the plurality of spin transfer torque memory cells, wherein the base layer and the emitter contact layer provides an electrical path for the plurality of collector contacts.

2. A spin transfer torque memory apparatus according to claim 1, wherein the collector contacts and the emitter contact layer have N type conductivity and the base layer has P type conductivity.

3. A spin transfer torque memory apparatus according to claim 1, wherein the collector contacts and the emitter contact layer have P type conductivity and the base layer has N type conductivity.

4. A spin transfer torque memory apparatus according to claim 1, wherein the spin transfer torque memory cells comprise magnetic tunnel junctions switchable between a high resistance data state and a low resistance data state by spin torque transfer of a polarized current through the magnetic tunnel junction.

5. A spin transfer torque memory apparatus according to claim 1, wherein the word line and the source line provide an electrical path to the plurality of spin transfer torque memory cells by selecting a desired bit line.

6. A spin transfer torque memory apparatus according to claim 1, further comprising a plurality of bipolar select devices, wherein each bipolar select device forms a row of a memory array.

7. A spin transfer torque memory apparatus according to claim 6, wherein each bipolar select device is electrically isolated from each other.

8. A spin transfer torque memory apparatus according to claim 6, wherein each bipolar select device is electrically isolated from each other by deep trench isolation.

9. A spin transfer torque memory apparatus according to claim 1, wherein the emitter contact layer extends along a length of the bipolar select device and the plurality of collector contacts are disposed along the length of the bipolar select device.

10. A spin transfer torque memory array, comprising:
a plurality of bipolar select devices, each bipolar select device forming a row of a memory array, each bipolar select device comprising:
a semiconductor substrate;
a plurality of collector contacts disposed in a first side of the of the semiconductor substrate, wherein each collector contact is electrically isolated from each other;
an emitter contact layer disposed in a second side of the semiconductor substrate, the second side opposing the first side, the emitter contact layer being electrically coupled to a source line; and
a base layer separating the plurality of collector contacts from the emitter contact layer, the base layer being electrically coupled to a word line; and
a plurality of spin transfer torque memory cells, wherein one of the plurality of spin transfer torque memory cells is electrically coupled to one of the plurality of collector contacts and a bit line associated with the one of the plurality of spin transfer torque memory cells, wherein the base layer of each bipolar select device and the emitter contact layer of each bipolar select device provides an electrical path for the plurality of collector contacts for the bipolar select device.

11. A spin transfer torque memory array according to claim 10, wherein each bipolar select device is electrically isolated from each other.

12. A spin transfer torque memory array according to claim 10, wherein each bipolar select device is electrically isolated from each other by deep trench isolation.

13. A spin transfer torque memory array according to claim 10, wherein the emitter contact layer extends along a length of the bipolar select device and the plurality of collector contacts are disposed along the length of the bipolar select device.

14. A spin transfer torque memory array according to claim 10, wherein the collector contacts and the emitter contact layer have N type conductivity and the base layer has P type conductivity.

15. A spin transfer torque memory array according to claim 10, wherein the collector contacts and the emitter contact layer have P type conductivity and the base layer has N type conductivity.

16. A spin transfer torque memory array according to claim 10, wherein the spin transfer torque memory cells comprise magnetic tunnel junctions switchable between a high resistance data state and a low resistance data state by spin torque transfer of a polarized current through the magnetic tunnel junction.

17. A spin transfer torque memory array according to claim 10, wherein the word line and the source line provide an electrical path to the plurality of spin transfer torque memory cells by selecting a desired bit line.

18. A method, comprising:
writing a first data state to a plurality of spin transfer torque memory cells by applying a forward bias across an emitter contact layer of a bipolar select device and selected bit lines electrically coupled to the plurality of spin transfer torque memory cells to be written to, wherein the bipolar select device comprises:
a semiconductor substrate;
a plurality of collector contacts disposed in a first side of the of the semiconductor substrate, wherein each collector contact is electrically isolated from each other and each collector is electrically coupled to a spin transfer torque memory cell;
the emitter contact layer disposed in a second side of the semiconductor substrate, the second side opposing the first side, the emitter contact layer being electrically coupled to a source line; and
a base layer separating the plurality of collector contacts from the emitter contact, the base layer being electrically coupled to a word line.

19. A method according to claim 18, further comprising writing a second data state to a plurality of spin transfer torque memory cells by applying a reverse bias across an emitter contact layer of a bipolar select device and selected bit lines electrically coupled to the plurality of spin transfer torque memory cells to be written to.

20. A method according to claim 18, wherein the writing step comprises applying a spin polarized current thought the spin transfer torque memory cells.

* * * * *